(12) United States Patent
Woods et al.

(10) Patent No.: US 7,012,537 B2
(45) Date of Patent: Mar. 14, 2006

(54) APPARATUS AND METHOD FOR DETERMINING VOLTAGE USING OPTICAL OBSERVATION

(75) Inventors: Gary Leonard Woods, Sunnyvale, CA (US); Steven Kasapi, San Fracisco, CA (US)

(73) Assignee: Credence Systems Corporation, Milpitas, CA (US)

( * ) Notice: Subject to any disclaimer, the term of this patent is extended or adjusted under 35 U.S.C. 154(b) by 8 days.

(21) Appl. No.: 10/845,013

(22) Filed: May 14, 2004

(65) Prior Publication Data

US 2005/0174248 A1    Aug. 11, 2005

Related U.S. Application Data

(60) Provisional application No. 60/543,003, filed on Feb. 10, 2004.

(51) Int. Cl.
G08B 21/00    (2006.01)

(52) U.S. Cl. .............. 340/635; 340/636.1; 340/636.25; 340/660; 340/661; 340/657; 340/514

(58) Field of Classification Search ................ 340/635, 340/636.1, 636.15, 660, 661, 657, 514
See application file for complete search history.

(56) References Cited

U.S. PATENT DOCUMENTS

| 3,524,694 | A | 8/1970 | Klein et al. .................. 350/177 |
| 3,711,186 | A | 1/1973 | O'Connor .................... 350/214 |
| 3,912,378 | A | 10/1975 | Goto .......................... 350/175 |
| 4,297,032 | A | 10/1981 | Temple ....................... 356/366 |
| 4,353,618 | A | 10/1982 | Hagner et al. ................ 350/91 |
| 4,555,767 | A | 11/1985 | Case et al. ................... 364/563 |
| 4,615,620 | A | 10/1986 | Noguchi et al. ............. 356/378 |
| 4,625,114 | A | 11/1986 | Bosacchi et al. ........... 250/341 |
| 4,634,234 | A | 1/1987 | Baumann ..................... 350/414 |
| 4,680,635 | A | 7/1987 | Khurana ...................... 358/211 |
| 4,724,322 | A | 2/1988 | Knowles et al. ............. 250/341 |
| 4,758,092 | A | 7/1988 | Heinrich et al. ............. 356/364 |
| 4,811,090 | A | 3/1989 | Khurana ...................... 358/93 |

(Continued)

FOREIGN PATENT DOCUMENTS

JP         407320173      * 12/1995

(Continued)

OTHER PUBLICATIONS

All-Solid-State microscope-based system for picosecond time-resolved photoluminescence measurements on II-VI semiconductors, Buller et al., Rev. Sci. Instrum. 63 (5) pp. 2994-2998, 1992.

(Continued)

*Primary Examiner*—Julie Bichngoc Lieu
(74) *Attorney, Agent, or Firm*—Sughrue Mion, PLLC; Joseph Bach, Esq.

(57) ABSTRACT

A beacon circuit enabling study of active elements in an integrated circuit is disclosed. The beacon circuit may be integral to a DUT to be tested. The DUT is stimulated by a conventional ATE, so that its active devices are operating. The signal from the active device is sent to the beacon circuit which, in response to the signal, emits light having intensity that is proportional to the value of the signal. In one example, the beacon circuit is constructed as a voltage to current converter having its input connected to the node of interest and its output connected to a current to light converter. In one example, the current to light converter is implemented as a current mirror circuit. One beneficial implementation disclosed is the use of the beacon circuit for the study of voltage supply disturbances.

22 Claims, 3 Drawing Sheets

U.S. PATENT DOCUMENTS

| | | | |
|---|---|---|---|
| 5,004,307 A | 4/1991 | Kino et al. | 350/1.2 |
| 5,087,121 A | 2/1992 | Kakuchi et al. | 356/73 |
| 5,208,648 A | 5/1993 | Batchelder et al. | 356/237 |
| 5,220,403 A | 6/1993 | Batchelder et al. | 356/345 |
| 5,247,392 A | 9/1993 | Plies | 359/661 |
| 5,282,088 A | 1/1994 | Davidson | 359/664 |
| 5,475,316 A | 12/1995 | Hurley et al. | 324/750 |
| 5,940,545 A | 8/1999 | Kash et al. | 382/312 |
| 6,621,275 B1 | 9/2003 | Cotton et al. | 324/537 |
| 6,737,813 B1 * | 5/2004 | Kawasaki et al. | 315/169.3 |

FOREIGN PATENT DOCUMENTS

WO     WO00/79313     12/2000

OTHER PUBLICATIONS

Time-Resolved photoluminescence measurements in InGaAs/InP multiple-quantum-wellstructures at 1.3-μm wavelengths by use of germanium single-photon avalanche photodiodes; G.S.Buller et al. Appl. Optics, vol. 35, No. 6 pp. 916-921, 1996.

Analysis of Product Hot ElectronProbloems by Gated Emission Microscope, Khurana et al., IEEE/IRPS, 1986.

On-Die Droop Detector for Analog Sensing of Power Supply Noise, Ali Muhtaroglu, Greg Taylor, Tawfik Rahal-Arabi, IEEE Journal of Solid-State Circuits, vol. 39, No. 4, Apr. 2004.

Two-dimensional time-resolved imaging with 100-ps resolution using a resistive anode photomultiplier tube, S. Charbonneau et al. Rev. Sci. Instru. 63 (11) pp. 5315-5319, 1992.

Picosecond hot electron light emission from submicron complelemntary metal-oxide-semiconductor circuits, J.C. Tsang et al. Appl. Phys. Lett. vol. 70 No. 7, pp. 889-891.

Diagnosis and Characterization of Timing-Related Defects by Time-Dependent Light Emission, Knebel et al., (no citation available).

Dynamic Internal Testing of CMOS Circuits Using Hot Luminescence, J. A. Kash and J. C. Tsang, IEEE Electron Device Letters, vol. 18, pp. 330-332, 1997.

* cited by examiner

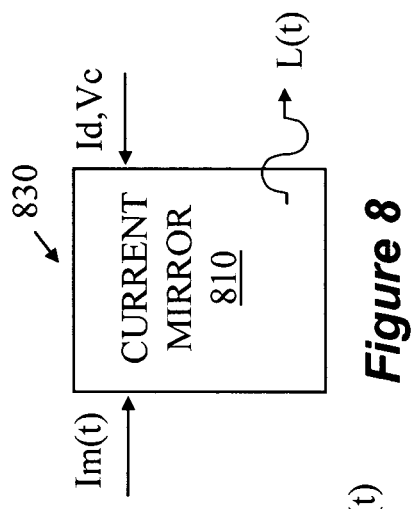
Figure 8
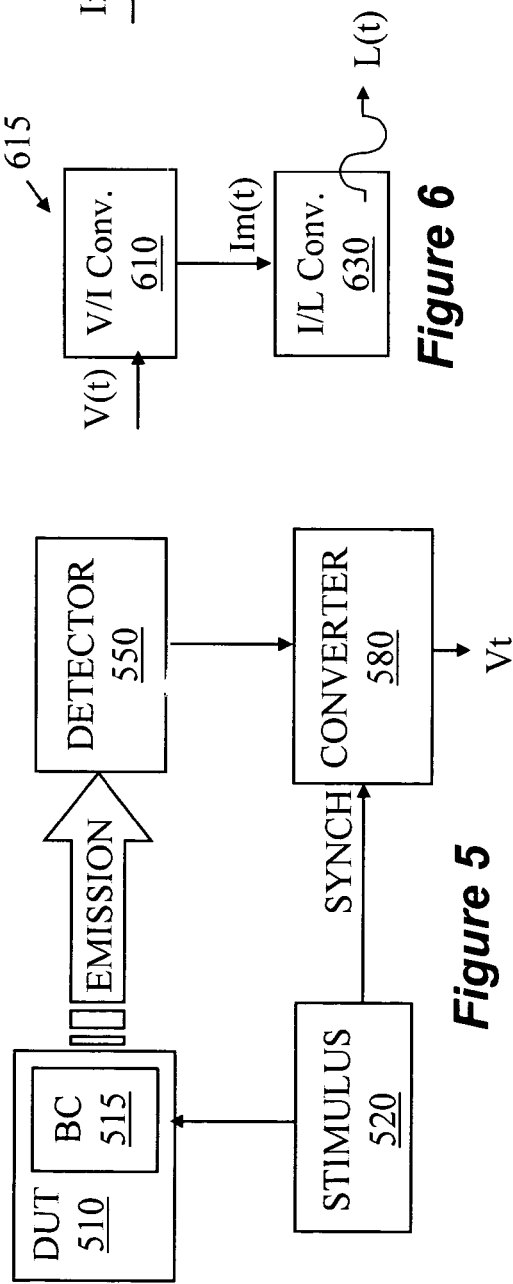
Figure 10
Figure 6
Figure 9
Figure 5
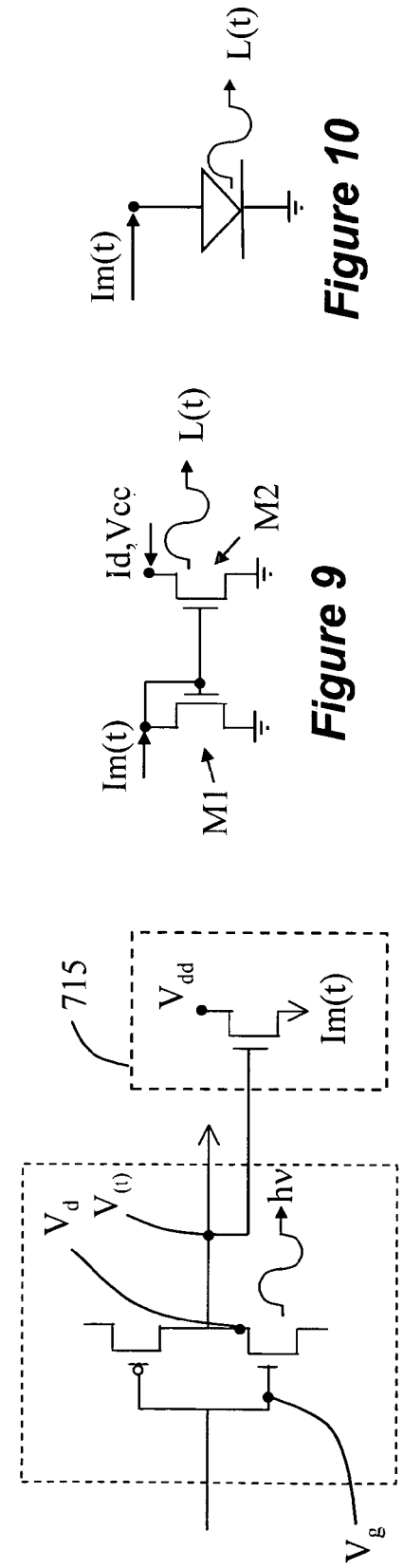
Figure 7

APPARATUS AND METHOD FOR DETERMINING VOLTAGE USING OPTICAL OBSERVATION

CROSS REFERENCE TO RELATED APPLICATIONS

This Application claims priority from U.S. Provisional Application Ser. No. 60/543,003, filed Feb. 10, 2004, which is incorporated herein by reference in its entirety.

BACKGROUND OF THE INVENTION

1. Field of the Invention

The present invention relates to an apparatus and method for determining time-resolved voltage at a node in an integrated circuit using optical observation.

2. Description of the Related Art

It is known in the prior art that various mechanisms in semiconductor devices can cause light emission. Detection of such light emission has been used to investigate semiconductor devices. For example, avalanche breakdown in insulators causes light emission, and detection of such light emission can point to the locations of failure in the device. Similar detection can be used to characterize electrostatic discharge in the device. In electrically stimulated (active) transistors, accelerated carriers (electrons & holes), i.e., hot-carriers, emit light when the device draws current. Various emission microscopes have been used for detecting locations on the device where the electrical current drawn exceeds the expected levels and therefore could lead to locating failures in semiconductor devices. Examples of emission microscopes may be found in U.S. Pat. Nos. 4,680,635; 4,811,090; and 5,475,316.

For transistors, such as those in complementary metal oxide semiconductor (CMOS) devices, the current "pulse" coincides (in-time and characteristics) directly with the voltage transition responsible for the change in the state (logic) of the device. Therefore, resolving in time the hot-electron emissions from electrically active semiconductor transistor devices indicates the behavior and response of the device to electrical currents and the temporal relations of the current pulses with respect to each other. These temporal characteristics, along with the detection of the transition (pulse) itself, are of critical importance in the design and debug of integrated circuit (IC) devices. Related works on the subject have been published and represented by the following papers:

All-Solid-State Microscope-Based System for Picosecond Time-Resolved Photoluminescence Measurements on II–VI semiconductors, G. S. Buller et al., Rev. Sci. Instrum. pp. 2994, 63, (5), (1992);

Time-Resolved Photoluminescence Measurements in InGaAs/InP Multiple-Quantum-Well Structures at 1.3-m Wavelengths by Use of Germanium Single-Photon Avalanche Photodiodes, G. S. Buller et al., Applied Optics, Vol 35 No. 6, (1996);

Analysis of Product Hot Electron Problems by Gated Emission Microscope, Khurana et al., IEEE/IRPS (1986);

Ultrafast Microchannel Plate Photomultiplier, H. Kume et al., Appl. Optics, Vol 27, No. 6, 15 (1988);

Two-Dimensional Time-Resolved Imaging with 100-ps Resolution Using a Resistive Anode Photomultiplier Tube, S. Charboneau, et al., Rev. Sci. Instrum. 63 (11), (1992); and Dynamic Internal Testing of CMOS Circuits Using Hot Luminescence, J. A. Kash and J. C. Tsang, IEEE Electron Device Letters, vol. 18, pp. 330–332, 1997.

Notably, Khurana et al., demonstrated that photoluminescence hot-carrier emission coincides in time and characteristics with the current pulse, i.e., the voltage switching of a transistor, thereby teaching that, in addition to failure analysis (location of "hot-spots" where the device may be drawing current in excess of its design), the phenomenon can also be used for obtaining circuit timing information (switching) and therefore used for IC device debug and circuit design. See, also, U.S. Pat. No. 5,940,545 to Kash et al., disclosing a system for such an investigation. For more information about a time-resolved photon emission system the reader is directed to U.S. Pat. No. 6,621,275, commonly assigned to the current assignee and incorporated herein by reference in its entirety. Such a system is commercially available under the trademark EmiScope® from assignee, Optonics Inc., a Credence Company, of Mountain View, Calif.

FIG. 1 is a block diagram depicting an arrangement of a conventional time-resolved emission system. A device under test (DUT) 110 is being stimulated by stimulus 120, e.g., a conventional automated testing equipment (ATE 205 in FIG. 2). The ATE also sends a start signal to the time-to-digital converter 180, so that it is synchronized therewith. When the DUT emits light in response to the stimulus 120, the light is detected by detector 150, which then sends a signal to the time-to-digital converter 180, so that the timing of the emission can be determined.

FIG. 2 depicts the general elements of the system, as it is coupled to a commercially available ATE 205. The ATE 205 generally comprises a controller, such as a pre-programmed computer 281, and a test head 224, which comprises an adapter 225 used to deliver signals programmed by the controller 281 to the DUT (not shown) in a manner well known in the art. Specifically, the ATE is used to generate signals that stimulate the DUT to perform various tasks, as designed by the chip designer to check and/or debug the chip. The various signals generated by the controller test head 224 are programmed by the controller 281 and are delivered by the test head 224 to the DUT via the adapter 225. The adapter 225 may include a space transformer, a DUT load board and a DUT socket, in a manner well known in the art.

In the embodiment depicted in FIG. 2, the ATE test head 224 is placed over opening 285 on the top of a vibration isolated bench 215. Chamber 200 houses the main components of the diagnostic system, and is situated below, so that once the ATE head 224 is connected to the system, no external light can reach the elements inside chamber 200. The diagnostic system is controlled by controller 280, such as a pre-programmed general-purpose computer, which also communicates with the ATE controller 281.

FIG. 3 depicts an illustrative circuit having two complementary switching elements. As the voltage, Vg, on the gate changes, light, hυ, is emitted. The voltage rise/fall to be investigated is marked at V(t), while the voltage of the drain of the switching element is marked as $V_d$.

FIG. 4 is a graph showing at the top a plot of voltage versus time, V(t), and on the bottom a plot of light emission, L(t), by the switching element. From FIG. 3, one can appreciate that V(t) directly correlates to $V_d$. As depicted, as the element switches, the voltage across it, $V_d$, drops and, at some point during the voltage drop, $t_1$, the element emits a pulse of light that can be detected by the system of FIGS. 1 and 2. Similarly, when the element reverse-switches, the voltage, $V_d$, increases and at a certain time during the voltage rise, $t_2$, a pulse of light is emitted. The light emission L(t) is generally given by:

$$L_{(t)} \approx V_x(t)I_{(t)} \text{Exp}[-V_c/V_x(t)];$$

$$V_x(t) \approx V_d(t) - V_d\text{,sat}(t);$$

$$V_d\text{,sat} \approx Vg(t) - Vth$$

where Vc is a constant specific to the device under investigation (a function of the device structure, material composition, manufacturing process etc.), $V_d$ is the voltage at the drain, $V_d$,sat is the saturation voltage at the drain, Vg(t) is the voltage at the gate, and $V_{th}$ is a threshold voltage.

As can be appreciated, the light pulse is narrower in time than the voltage drop/rise, and provides no information about the "behavior" or "history" of the voltage change. In particular, the emission is highly nonlinear in the voltage $V_d$ and is not generally useful for obtaining quantitative voltage information. Obtaining such a linear indicator of the voltage at all times is of great interest to chip designers. Additionally, as is well known, since the current drawn by the device of interest is very small, the emission of the switching device is very faint, requiring single photon detection technology and repeated measurement for obtaining accurate timing of the emission.

SUMMARY OF THE INVENTION

The present invention provides novel apparatus and method for characterizing semiconductor circuits' operation and failure modes. The inventive apparatus and method enables the study of voltage rise/decay at a given node in an integrated circuit using optical imaging. Furthermore, embodiments of the inventive apparatus provide light emission having intensity that is easier to detect and has a relatively linear relationship to the voltage sought to be studied.

In one aspect of the invention, a novel "beacon circuit" is constructed and connected to the node under investigation. The beacon circuit is constructed so that it emits light having intensity proportional to the voltage across the node in question. The light is detected by the system and, using a reverse function, the light intensity is translated into voltage.

In one specific implementation, the inventive circuit is used to detect voltage glitches, such as those caused by the power supply.

Other aspect and benefits of the invention can be understood from the drawings, description, and claims provided below.

BRIEF DESCRIPTION OF THE DRAWINGS

The invention is described herein with reference to particular embodiments thereof, which are exemplified in the drawings. It should be understood, however, that the various embodiments depicted in the drawings are only exemplary and may not limit the invention as defined in the appended claims.

FIG. 5 is a block diagram depicting the major components of the system according to an embodiment of the invention.

FIG. 6 depicts a block diagram of a beacon circuit according to an embodiment of the invention.

FIG. 7 depicts an embodiment of a voltage to current converter 715.

FIG. 8 is a block diagram exemplifying an embodiment of the current to light converter.

FIG. 9 depicts an embodiment of a current mirror.

FIG. 10 depicts another embodiment of current to light converter.

FIGS. 12a and 12b depict embodiments wherein the inventive beacon circuit is used to study voltage glitches; while

DETAILED DESCRIPTION

The present invention provides a testing and debug system particularly suitable for rise time, timing, logic fault localization, and other testing of microchips. The investigation is performed with respect to a time correlation to electrical stimulus provided to the DUT, by detecting light emitted from a specially designed beacon circuit. The beacon circuit is connected to, or fabricated integrally with the DUT.

Figure 2:
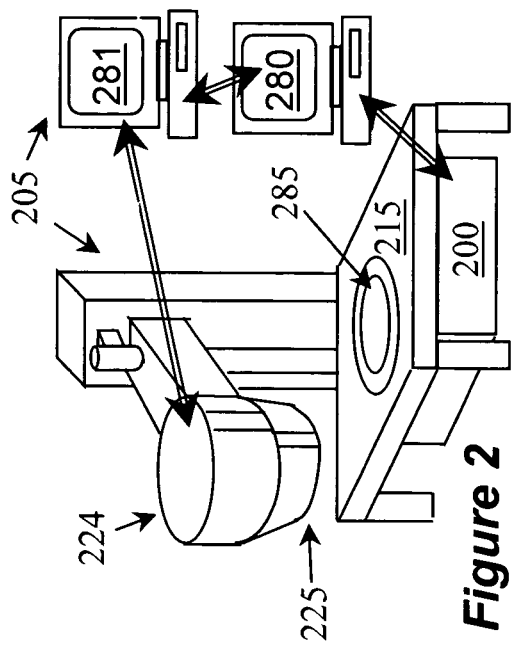
FIG. 2 is a general schematic depicting the major components of a system for investigation of semiconductor circuits.
Figure 1:
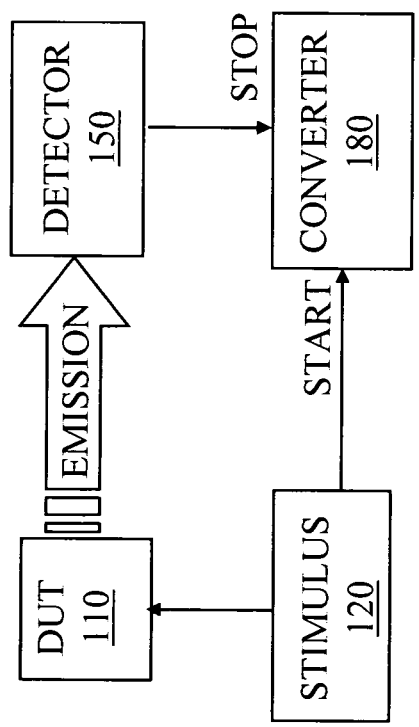
FIG. 1 is a block diagram of prior art systems for investigation of semiconductor circuits.
Figure 4:
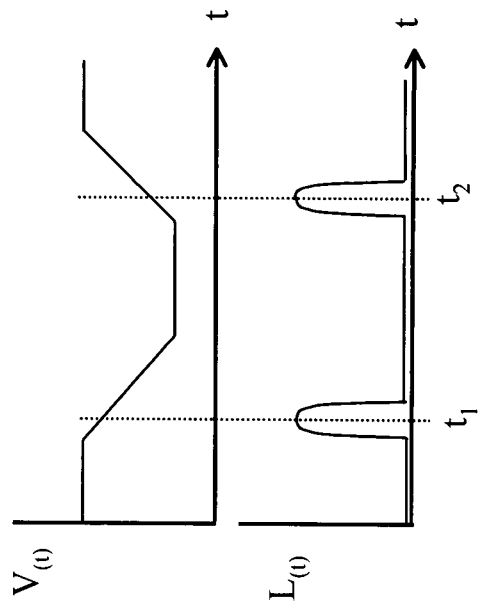
FIG. 4 is a graph showing at the top a plot of voltage versus time, V(t), and on the bottom a plot of light emission by the switching element receiving the voltage V(t).
Figure 3:
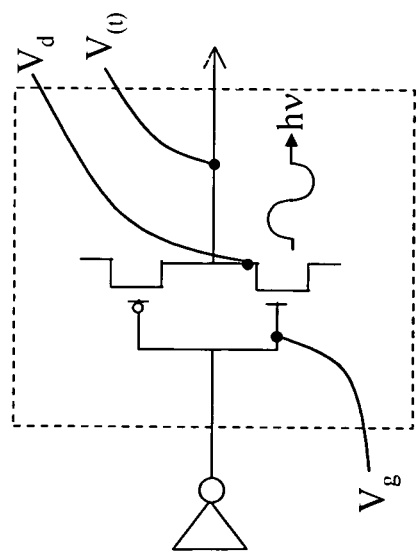
FIG. 3 depicts an illustrative circuit having a switching element and where the voltage of interest is V(t).

FIG. 5 is a block diagram depicting the major components of the system according to an embodiment of the invention. As shown, beacon circuit 515 is fabricated within DUT 510, and is connected to a node of interest within the DUT (see, e.g., FIG. 7). The DUT 510 is stimulated, 520, by, e.g., an ATE shown in FIG. 2, that also provides a synch Signal to converter 580. When DUT 510 is stimulated, beacon circuit 515 emits light, which is collected and detected by detector 550. The signal from the detector 580 is input to converter 580, which manipulates the signal to provide voltage, $V_t$, corresponding to a voltage in a node of interest in the DUT. The beacon circuit is designed so it provides light having intensity correlating to the voltage at the node of interest in the DUT. It is also designed so that the overall intensity is much higher than that emitted from the switching device of interest, so that it is much easier to detect and measure.

FIG. 6 depicts a block diagram of a beacon circuit according to an embodiment of the invention. As shown, the beacon circuit 615 is generally constructed as two parts: a voltage to current converter, 610, and a current to light converter 630. The voltage, V(t), at the node of interest is input to the voltage to current converter. The voltage converter then provides a current output, Im(t), which correlates to the input voltage V(t) according to determinable formula. As can be understood from the disclosure below, the formula can be either derived from basic principles or determined empirically by running and measuring various values therethrough. As can be understood, a current to voltage linear relationship would be particularly desirable, and a circuit providing such a relationship is shown in FIG. 9, discussed further below.

The current, Im(t), is the input to a current to light converter that emits light, L(t), proportionally to the current. Here, again, a linear relationship would be particularly advantageous, and circuits to obtain such a relationship are illustrated in the various embodiments discussed below.

We will now turn to a discussion of various embodiments for implementing the voltage to current converter and the current to light converter. It should be noted, however, that these embodiments were designed with common goals in mind. That is, the voltage to current converter is advantageously designed so that the output current is linear with the input voltage. This will make it easier to correlate the detected light intensity to the voltage of interest. Additionally, the voltage to current converter is designed so that it may draw a relatively high current, i.e., high current relative to the device of interest. This will enable light emission with high intensity, i.e., high intensity with respect to the light emitted by the device of interest. Finally, to maintain these advantages, the current to light converter is designed so that the emitted light intensity is linearly proportional to the input current.

FIG. 7 depicts an embodiment of a voltage to current converter 715. The converter is constructed of, for example, a pMOS or nMOS transistor, the gate of which is connected to the node of interest in the DUT. The drain of the transistor is connected to a voltage supply $V_{dd}$, which enables the transistor to draw variable level of current—depending on the voltage V(t) applied to its gate. Using this construction the output at the drain of the transistor is current Im(t), which correlates to the voltage V(t). As noted above, by running various voltages to the gate and measuring the current output, the functional correlation between the input voltage and output current can be determined.

FIG. 8 is a block diagram exemplifying an embodiment of the current to light converter 830. In this embodiment the current to light converter is made in the form of a current mirror 810. The current mirror 810 is fed the current Im(t) output from the voltage to current converter. Additionally, a constant voltage, $V_{cc}$, is supplied with a variable current, $I_d$, to the current mirror. The current mirror then outputs light, L(t), that is proportional to the drawn current, $I_{dd}$, because the voltage, $V_{cc}$, is kept constant. The drawn current, $I_{dd}$, simply equals a constant time the current, Im(t) provided by the voltage to current converter. Also, in order to obtain higher light output, the constant voltage $V_{cc}$ is selected to have much higher value than the typical voltage at the node of interest V(t). Note that the voltage V(t) cannot be made higher, as it must be kept at the normal operational voltage of the DUT circuit.

The functional correlation between the light output L(t) and the input current Im(t) can be derived from basic principles or determined empirically by providing various input currents and measuring the output light. Once the functional relationships have been determined, they can be programmed into, for example, an EmiScope system. Then, during testing, when the system detects an emitted light, the functional relationship can be used to derive the voltage at the node of interest. Mathematically, the functional relationships can be expressed as follows. The light emission is expressed as:

$$L(t) \sim Vc * Id(t) * \mathrm{Exp}[-V_0/(Vc-Vn)]$$

As seen from this expression, the light emission is linear with respect to the current, but exponential with respect to the voltage. Since in the depicted embodiments Vc is constant, $\mathrm{Exp}[-V_0/(Vc-Vn)]$ is constant, say $C_1$. Thus, the light emission is linear with respect to the current and can be expressed as:

$$L(t) \sim Vc * Id(t) * C_1$$

The current drawn by the current mirror, Id(t), can be expressed as:

$$Id(t) \sim C_2 * Im(V(t))$$

Where C is a constant and Im(V(t)) is the current from the voltage to current converter, expressed as a function of the voltage at the node of interest. Therefore, the current drawn can be expressed as:

$$Id(t) \alpha\ Im(t) \alpha\ V(t).$$

Hence, the light output is linear in the voltage: $L(t) \sim Id(t) \sim Im(t) \sim V(t)$.

Thus, using the disclosed embodiment the voltage can be easily determined from the detected light.

FIG. 9 depicts an embodiment of a current mirror. As shown the current mirror is constructed using two transistors, M1 and M2, having their gates connected to each other, and their sources connected to ground (or other common potential). The gate of transistor M1 is connected to its drain, which receives the current Im(t) output by the voltage to current converter. The drain of transistor M2 is connected to the constant-voltage power source, Vc. As noted above, for an improved performance, the constant voltage, Vc, may be selected at a higher value that the normal operating voltage, V(t), at the node of interest. Since the source of transistor M2 is kept at a constant voltage, and since its gate is connected to the gate of transistor M1, which receives the input current Im(t), transistor M2 draws current, Id(t), proportionally to the input current Im(t). As transistor M2 draws current Id(t), it emits light, L(t), proportionally to the drawn current Id(t).

FIG. 10 depicts another embodiment of current to light converter. In this embodiment the current to light converter is constructed of a forward biased diode. As the diode receives the current Im(t), it emits light proportionally to the current. This light is detected and its value used to trace back to voltage at the node of interest. Since the diode is connected to the voltage to current converter, the current flowing through the diode is higher than that flowing in the device of interest and, therefore, the intensity of the light emitted from the diode is relatively high, and is linear, or at least functionally determinable, with the input current. This enables increased detection of emitted light and better correlation to the voltage of the device of interest.

Figure 11:
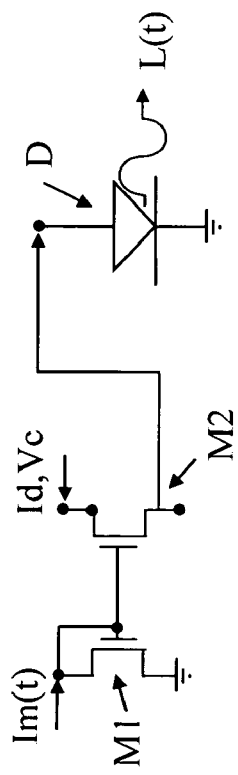
FIG. 11 depicts a hybrid current to light converter.

FIG. 11 depicts a hybrid current to light converter. In this embodiment, the current mirror of FIG. 9 is used to derive the forward biased diode of FIG. 10, so that the diode emits the light. As can be understood, transistor M2 of the current mirror will emit light as it switches due to voltage received from transistor M1; however, by proper selection of diode D one can obtain increased light intensity and better linearity of the emitted light intensity.

As can be understood from the above, many variations of the inventive beacon circuit can be made to as to implement the described invention. However, it is recommended that two beneficial features of the inventive beacon circuit should be maintained, i.e., increasing the emitted light's intensity and providing a linear relationship between the light intensity and the voltage at the node of interest. For example, while various embodiments of the voltage to current and current to light converters have been disclosed, other circuits can be designed to provide the desired outcome.

Figure 12A:
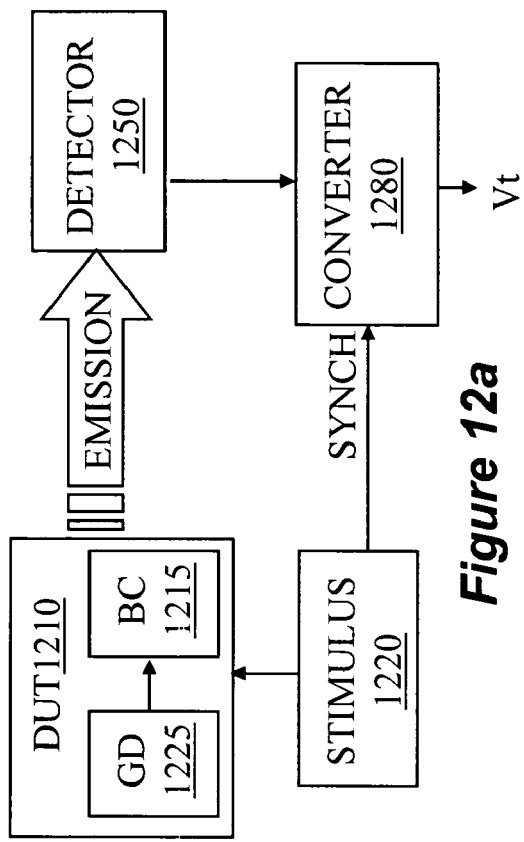
Figure 13:
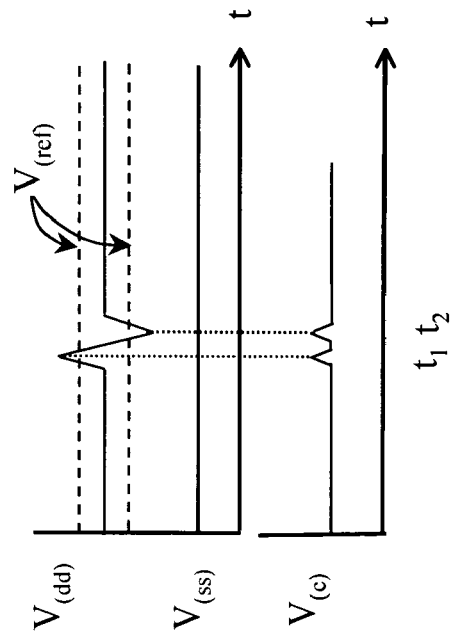
FIG. 13 shows the voltages of the power supply and the glitch detector circuit.

One example where the inventive beacon circuit is beneficial is for the study of power supply noise, e.g., voltage glitches. Voltage glitches are known in the art. For a discussion of voltage glitches and one method to detect the glitches, the reader is directed to On-Die Droop Detector for Analog Sensing of Power Supply Noise, Ali Muhtaroglu, Greg Taylor, and Tawfik Rahal-Arabi, IEEE Journal of Solid-State Circuits, Vol. 39, No. 4, April 2004. FIG. 12a depicts in block diagram how the inventive beacon circuit and be employed to study power supply voltage variations. In this example, the DUT 1210 incorporates a glitch detector 1225, the output of which is input to the beacon circuit 1215. When a stimulus is provided to the DUT, the power supplier provides voltages Vdd and Vss to the various operable circuits of the DUT (FIG. 13). In order for the DUT to operate properly, voltages Vdd and Vss need to be stable and within set limits, e.g., limits Vref shown in FIG. 13 for Vdd.

When the voltage from the power supply varies beyond the limit, the glitch detector 1225 monitors the voltage provided by the voltage supplier and, when a disturbance, e.g., a glitch, occurs, the glitch detector 1225 provides a signal to the beacon circuit 1215, e.g., the signal V(t) at t1 and t2 in FIG. 13. Glitch detector 1225 can be implemented using the example provided by Muhtaroglu et al. in the paper cited above. The beacon circuit 1215 receives signal Vc and then emits light which is detected by the detector 1250. The signal from the detector 1250 is provided to the converter 1280 to study the voltage glitches on the power supplies.

Figure 12B:
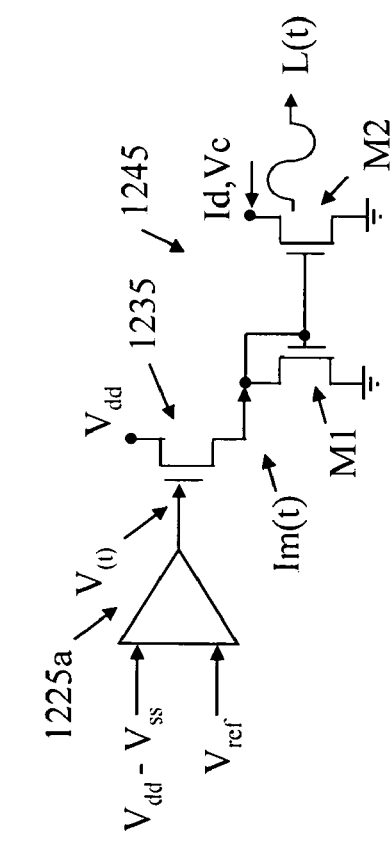

FIG. 12*b* depicts an example of the circuit that can be used to study voltage glitches. Notably, a comparator 1225*a* receives at one input a voltage whose ac value is the same as the ac difference between Vdd and Vss, and a reference signal Vref at a second node. When the difference voltage (Vdd−Vss) is below the reference signal Vref, a constant signal V(t) (or no voltage) is provided by the comparator 1225*a*. However, when the difference voltage surpasses the reference voltage Vref, then output voltage V(t) is increased, e.g., linearly with the amount the difference voltage surpasses the reference voltage Vref. Voltage V(t) is provided to the gate of the voltage to current converter transistor 1235. The output current Im(t) output from the transistor 1235 is input to the source of transistor M1 of the current mirror 1245. Transistor M2 then emits light L(t) having intensity that is proportional to the voltage V(t). In this manner, the variations in the power supply voltages, Vdd and Vcc can be studied with high temporal resolution.

It should be appreciated that while in the example just discussed the beacon circuit is shown to enable study of glitches in voltage Vdd, the circuit depicted in FIG. 12*b* will also provide an indication when the disturbance is in voltage Vss. However, one may wish to separate the study of these two voltages by, for example, input voltage Vdd directly to the first node of the comparator, or input a difference signal that is Vdd−Vconstant. The same thing can be done with Vss and, in fact, one may provide two separate comparators 1225*a*, one for Vdd and one for Vss.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. An integrated circuit enabling the study of various active elements incorporated therein, comprising:
a substrate;
at least one active circuit element formed in said substrate, said active circuit element connected to at least one node of interest, the voltage at said node varying when said active circuit element operates;
at least one beacon circuit connected to said node, said beacon circuit emitting light whenever the voltage at said node changes; and,
said active circuit element emitting light that is fainter than light emitted by said beacon circuit.

2. The circuit of claim 1, wherein said beacon circuit is formed in said substrate integrally with said active circuit element.

3. The circuit of claim 1, wherein the intensity of said light emitted by said beacon circuit is substantially linearly proportional to the voltage at said node.

4. The circuit of claim 1, wherein said beacon circuit comprises a voltage to current converter.

5. The circuit of claim 4, wherein said beacon circuit further comprises a current to light converter.

6. The circuit of claim 5, wherein said current to light converter comprises a current mirror.

7. The circuit of claim 5, wherein said current to light converter comprises a light emitting diode.

8. The circuit of claim 6, wherein said current to light converter further includes a light emitting diode.

9. The circuit of claim 1, wherein said active element comprises a transistor.

10. The circuit of claim 1, wherein said active element comprises a voltage comparator.

11. The circuit of claim 10, wherein said voltage comparator provides a signal to said node, indicative of a voltage provided by a power supply.

12. An integrated circuit, enabling the study of various active elements incorporated therein, comprising:
a substrate;
at least one active circuit element formed in said substrate, said active circuit element connected to at least one node of interest, the volt at said node varying when said active circuit element operates;
a beacon circuit formed in said substrate integrally with said active element and connected to said node of interest;
wherein said beacon circuit emits light whenever the voltage at said node varies and wherein said active element comprises a transistor; and,
wherein said beacon circuit comprises:
a voltage to current converter having its input connected to said node of interest;
a current to light converter having its input connected to an output of said voltage to current converter.

13. The circuit of claim 12, wherein said current to light converter comprises a current mirror.

14. The circuit of claim 12, wherein said current to light converter comprises a light emitting diode.

15. The circuit of claim 13, wherein said current to light converter further comprises a light emitting diode.

16. The system of claim 12, wherein said active element comprises a voltage comparator.

17. A method for investigating an integrated circuit, comprising:
identifying an active element of interest in said interated circuit;
applying a test signal to said active element;
obtaining output voltage from said active element, said output voltage being variable with time and being output in response to said test signal;
providing said output voltage to a beacon circuit;
operating said beacon circuit so as to convert said voltage input to emitted light output;
detecting said emitted light and measuring its intensity;
using a determinable relationship to calculate the output voltage from the light intensity; and, wherein operating said beacon circuit comprises:
    converting said output voltage to an output current, said output current being variable with time in a first determinable relationship to said output voltage;
    converting said output current to said emitted light, the intensity of said emitted light being in a second determinable relationship to said output current.

18. The method of claim 17, wherein at least one of said first and second relationships is a linear relationship.

19. The method of claim 17, wherein converting the output current to emitted light comprises passing said current through a current mirror.

20. The method of claim 17, wherein converting the output current to emitted light comprises passing said current through a light emitting diode.

21. The method of claim 19, wherein converting the output current to emitted light further comprises applying the output of said current minor to a light emitting diode.

22. The method of claim 17, wherein obtaining said output voltage comprises monitoring an output of a power supplier and providing a signal whenever the output of said power supplier exceeds a predefined threshold.

* * * * *